(12) United States Patent
Jin et al.

(10) Patent No.: US 9,936,562 B2
(45) Date of Patent: Apr. 3, 2018

(54) MULTIFUNCTION LUMINOUS MODULE WITH SEGMENTED OLED DIODE

(71) Applicant: Valeo Vision, Bobigny (FR)

(72) Inventors: Hui Jin, Paris (FR); Christophe Dubosc, Villemomble (FR); David Hue, Butry sur Oise (FR)

(73) Assignee: VALEO VISION, Bobigny (FR)

( * ) Notice: Subject to any disclaimer, the term of this patent is extended or adjusted under 35 U.S.C. 154(b) by 358 days.

(21) Appl. No.: 14/853,187

(22) Filed: Sep. 14, 2015

(65) Prior Publication Data
US 2016/0081159 A1    Mar. 17, 2016

(30) Foreign Application Priority Data
Sep. 15, 2014   (FR) ................................ 14 58666

(51) Int. Cl.
| | |
|---|---|
| H01J 1/62 | (2006.01) |
| H05B 33/14 | (2006.01) |
| F21S 8/10 | (2006.01) |
| H01L 51/52 | (2006.01) |
| H05B 33/28 | (2006.01) |
| H05B 33/22 | (2006.01) |
| F21Y 105/00 | (2016.01) |
| F21Y 115/15 | (2016.01) |

(52) U.S. Cl.
CPC .......... *H05B 33/14* (2013.01); *F21S 48/1747* (2013.01); *F21S 48/211* (2013.01); *F21S 48/212* (2013.01); *F21S 48/217* (2013.01); *H01L 51/5203* (2013.01); *H01L 51/5225* (2013.01); *H05B 33/22* (2013.01); *H05B 33/28* (2013.01); *F21Y 2105/00* (2013.01); *F21Y 2115/15* (2016.08); *H01L 2251/5361* (2013.01)

(58) Field of Classification Search
USPC ........................................ 313/504, 506, 512
See application file for complete search history.

(56) References Cited

U.S. PATENT DOCUMENTS

| | | | |
|---|---|---|---|
| 8,508,136 | B2 | 8/2013 | Hente et al. |
| 8,659,048 | B2 | 2/2014 | Yim et al. |
| 8,710,735 | B2 | 4/2014 | Shirai et al. |
| 2011/0187285 | A1 | 8/2011 | Hente et al. |
| 2012/0292656 | A1 | 11/2012 | Yim et al. |
| 2013/0001595 | A1 | 1/2013 | Schwab |
| 2013/0240852 | A1 | 9/2013 | Yamazaki |
| 2013/0320841 | A1 | 12/2013 | Shirai et al. |

(Continued)

FOREIGN PATENT DOCUMENTS

| | | |
|---|---|---|
| DE | 112012000945 T5 | 11/2013 |
| DE | 202014101538 U1 | 6/2014 |
| WO | 2009101579 A1 | 8/2009 |

(Continued)

*Primary Examiner* — Vip Patel
(74) *Attorney, Agent, or Firm* — Oblon, McClelland, Maier & Neustadt, L.L.P.

(57) ABSTRACT

An organic light-emitting diode comprising a generally extensive first electrode; a generally extensive second electrode placed facing the first electrode, the second electrode comprising at least two portions that are electrically insulated from each other; at least one emissive organic layer placed between the first and second electrodes; and zones for electrically connecting the first and second electrodes. The zones for electrically connecting the first and second electrodes are located on at least one of the edges of the diode.

20 Claims, 3 Drawing Sheets

(56) References Cited

U.S. PATENT DOCUMENTS

2014/0056020 A1    2/2014    Bungenstock et al.
2015/0123095 A1    5/2015    Washio

FOREIGN PATENT DOCUMENTS

| WO | 2010029459 A1 | 3/2010 |
| WO | 2011107904 A1 | 9/2011 |
| WO | 2011117771 A1 | 9/2011 |
| WO | 2013168619 A1 | 11/2013 |

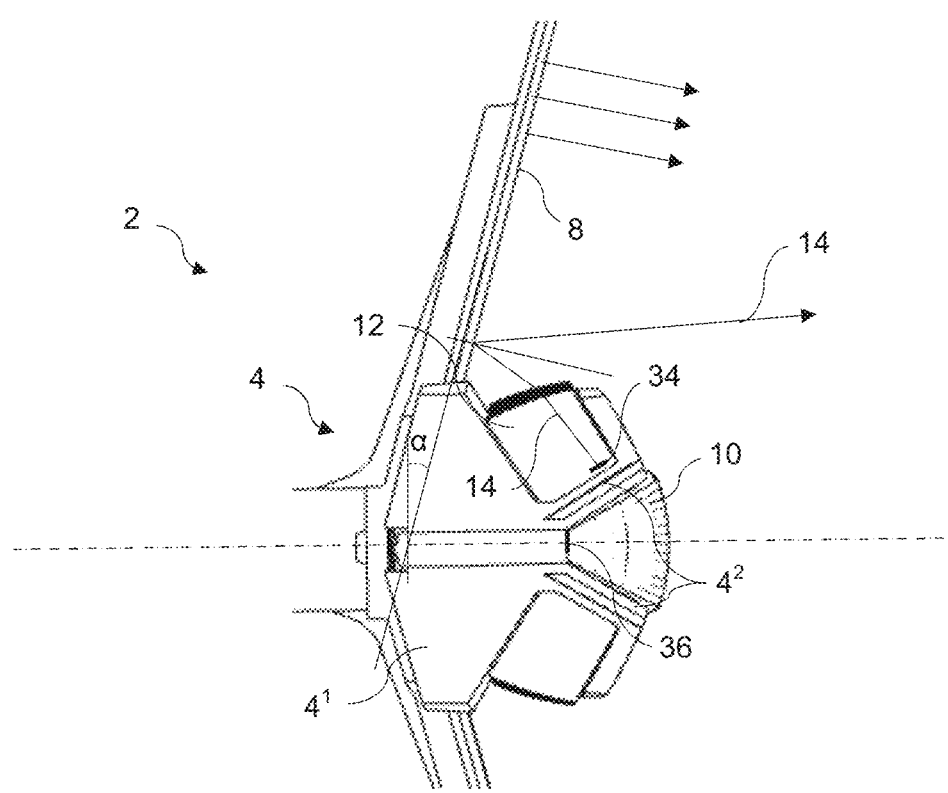

MULTIFUNCTION LUMINOUS MODULE WITH SEGMENTED OLED DIODE

CROSS-REFERENCE TO RELATED APPLICATIONS

This application claims priority to the French application 1458666 filed on Sep. 15, 2014, which application is incorporated herein by reference and made a part hereof.

BACKGROUND OF THE INVENTION

1. Field of the Invention

The invention relates to the field of luminous illumination and/or signaling, especially for an automotive vehicle. More precisely, the invention relates to the field of luminous illumination and signaling by means of light-emitting diodes (LEDs) and organic light-emitting diodes (OLEDs).

2. Description of the Related Art

An OLED diode consists of a superposition of a plurality of organic semiconductor layers between two electrodes one of which is transparent. The transparent electrode is customarily made of indium tin oxide (ITO). The main feature of indium tin oxide is its combination of electrical conductivity and optical transparency. However, a compromise must be reached during the film deposition, the increase in the concentration of charge carriers inducing an increase in the conductivity of the material, but also a decrease in its transparency. In other words, an electrode made of ITO with a good level of transparency has a limited conductivity.

Published patent document WO 2009/101579 A1 discloses a luminous module comprising an areal OLED light source and an optical device. The OLED light source is segmented so as to make it possible to modulate the light beam produced. For this purpose, it comprises an anode divided into two portions that are electrically independent from each other, and a common cathode, an organic light-emitting layer being placed between the anode and the cathode. Electrical connections are made to the two portions of the anode and to the cathode at different locations in the module and more precisely on opposite edges thereof. Specifically, the module is intended to serve as an illuminating module to be mounted on or in a wall. In this case, the back face of the module is in principle accessible in order to allow an electrical power supply to be connected thereto. Such a solution is however not favorable to projectional mounting of a holder of the module or to decreasing the thickness of the module.

Patent document DE 20 2014 101 538 U discloses a luminous module, especially for an automotive vehicle, comprising an areal OLED light source. This light source is divided into a plurality of zones that are activatable independently of one another. To do this, the areal diode consists of a stack of electrodes, with an organic light-emitting layer between each pair of adjacent electrodes. Each pair of adjacent electrodes may thus serve as anode and cathode with a view to the activation of the organic light-emitting layer placed between this pair of electrodes. This OLED diode construction is advantageous in that it allows a plurality of emission colors to be produced, depending on the choice of the materials of the organic light-emitting layers. It is however disadvantageous as regards its production cost and the potential loss of light produced by each electrode pair through the other layers. This teaching also does not seem to address the question of the electrical connection of the electrodes with a view to supplying them with power.

Published patent document US 2014/0056020 A1 discloses a luminous module for an automotive vehicle, comprising a series of areal OLED light sources. These OLED diodes are placed circularly. With reference to FIG. 4 and paragraphs [0034] and [0035] of this document, a generally extensive luminous module may comprise a plurality of, in the present case two, OLED diodes able to be activated independently of one another. Each of these OLED diodes may moreover be divided into a plurality of portions or segments. However, this teaching does not describe in any further detail the division of an OLED diode into a plurality of segments.

SUMMARY OF THE INVENTION

The objective of the invention is to provide an areal OLED light source mitigating at least one of the drawbacks of the aforementioned prior art. More particularly, the objective of the invention is to provide an areal OLED light source able to provide a plurality of light functions under favorable conditions, especially from an optical point of view, from a point of view of mounting on a holder and/or from a point of view of bulk thicknesswise.

One subject of the invention is an organic light-emitting diode comprising: a generally extensive first electrode; a generally extensive second electrode placed facing the first electrode, the second electrode comprising at least two portions that are electrically insulated from each other; at least one emissive organic layer placed between the first and second electrodes; zones for electrically connecting the first and second electrodes; and a plurality of edges; noteworthy in that the zones for electrically connecting the first and second electrodes are located on at least one of the edges of the diode.

Advantageously, the electrically connecting zones are intended to supply electrical power to the diode so that at least one portion of the diode emits light when the diode is powered.

Advantageously, the electrically connecting zones are located on a single edge of the diode.

According to one advantageous embodiment of the invention, the first electrode is electrically connected to at least two separate connecting zones.

According to one advantageous embodiment of the invention, at least one of the portions of the second electrode is electrically connected to at least two separate connecting zones.

According to one advantageous embodiment of the invention, the first electrode, or that portion or each of those portions of the second electrode which is/are electrically connected to at least two separate connecting zones, is connected to its connecting zones from positions on the electrode or portion that are distant from each other by a least a quarter and preferably half of the maximum extent of the electrode or portion.

According to one advantageous embodiment of the invention, at least one of the portions of the second electrode skirts around the other portion, or one of the other portions, from the edge or at least one of the edges comprising the electrically connecting zones.

According to one advantageous embodiment of the invention, the portion, or each of the portions, of the second electrode that skirts around the other portion or one of the other portions from the edge comprising the electrically connecting zones is electrically connected to two separate connecting zones that are placed on the edge on either side of at least one connecting zone electrically connected to the other or one of the other portions that it skirts around.

Optionally, at least one of the portions, or even each portion, of the second electrode is electrically connected to at least two separate connecting zones placed on two separate or even opposite edges of the diode. If needs be, the portion may extend over the entire length of the diode. In this case, the portions of the second electrode form adjacently placed electrode bands.

According to one advantageous embodiment of the invention, the first electrode and/or at least one of the portions of the second electrode comprises an electrical conductor extending along the electrode or electrode portion, the conductor being made of a material different from and more highly electrically conductive than the main material of the electrode or electrode portion.

According to one advantageous embodiment of the invention, the electrical conductor of the first electrode and/or of the portion or portions of the second electrode extends as far as the zone(s) of electrical contact of the electrode or electrode portion.

According to one advantageous embodiment of the invention, the electrical conductor or each of the electrical conductors has an average width smaller than 10 mm.

According to one advantageous embodiment of the invention, the material of the one or more electrical conductors is indium tin oxide (ITO) or aluminum or calcium.

According to one advantageous embodiment of the invention, the electrical conductor of the first electrode and/or of the portion or portions of the second electrode extends along an outline of the electrode or electrode portion.

According to one advantageous embodiment of the invention, the first electrode is reflective and/or the second electrode is transparent.

According to one advantageous embodiment of the invention, the second electrode consists of indium tin oxide.

According to one advantageous embodiment of the invention, the zones of electrical contact are located, preferably exclusively, in the extent of the diode on one of its two main faces.

Another subject of the invention is a luminous module, especially for an automotive vehicle, comprising: a holder of one or more light sources; and at least one areal organic light-emitting diode light source on the holder, able to emit a light beam oriented essentially along an optical axis of the module; noteworthy in that the one or more areal light sources are according to the invention, the light beam being modulatable by selective activation of portions of the second electrode.

The areal light source may be arranged so that the light beam provides a first photometric function, for example a position light, on activation of a single first portion of the second electrode. The areal light source may be arranged so that the light beam provides a second photometric function, for example an indicator, on activation of a single second portion of the second electrode. Optionally, the areal light source may be arranged so that the light beam provides a third photometric function, for example a stoplight, on activation of all the portions of the second electrode.

According to one advantageous embodiment of the invention, the one or more areal light sources extend transversely to the optical axis of the module.

According to one advantageous embodiment of the invention, the one or more areal light sources make an angle $\alpha$ to a direction perpendicular to the optical axis that is smaller than 30° and preferably 25° and more preferably 20°.

According to one advantageous embodiment of the invention, the angle $\alpha$ is larger than 3° and preferably 5° and more preferably 8°.

According to one advantageous embodiment of the invention, the light beam emitted by the one or more areal light sources is a first beam, the module comprising one or more additional light sources able to illuminate the one or more areal light sources and to form a second light beam by reflection from the areal light sources.

According to one advantageous embodiment of the invention, the module comprises an optical device, preferably a collimator, able to deviate the light rays emitted by the one or more additional light sources in a main direction, said deviated rays encountering the one or more areal light sources with a nonzero angle of incidence.

According to one advantageous embodiment of the invention, the first beam corresponds to an automotive vehicle position signaling function and/or the second beam corresponds to an automotive vehicle braking signaling function.

The measures of the invention are advantageous in that they favor mounting of the light source projecting from a holder. They are also advantageous in that they favor luminous uniformity by compensating for ohmic losses along the electrodes. The light source may thus be used as an emitter of light beams and as a reflector.

These and other objects and advantages of the invention will be apparent from the following description, the accompanying drawings and the appended claims.

Other features and advantages of the present invention will be better understood from the description and drawings, in which:

BRIEF DESCRIPTION OF THE
ACCOMPANYING DRAWINGS

FIG. 5 is a side view of the module in FIG. 1, illustrating the dual function of the areal OLED light sources.

DETAILED DESCRIPTION OF THE
PREFERRED EMBODIMENTS

Figure 1:
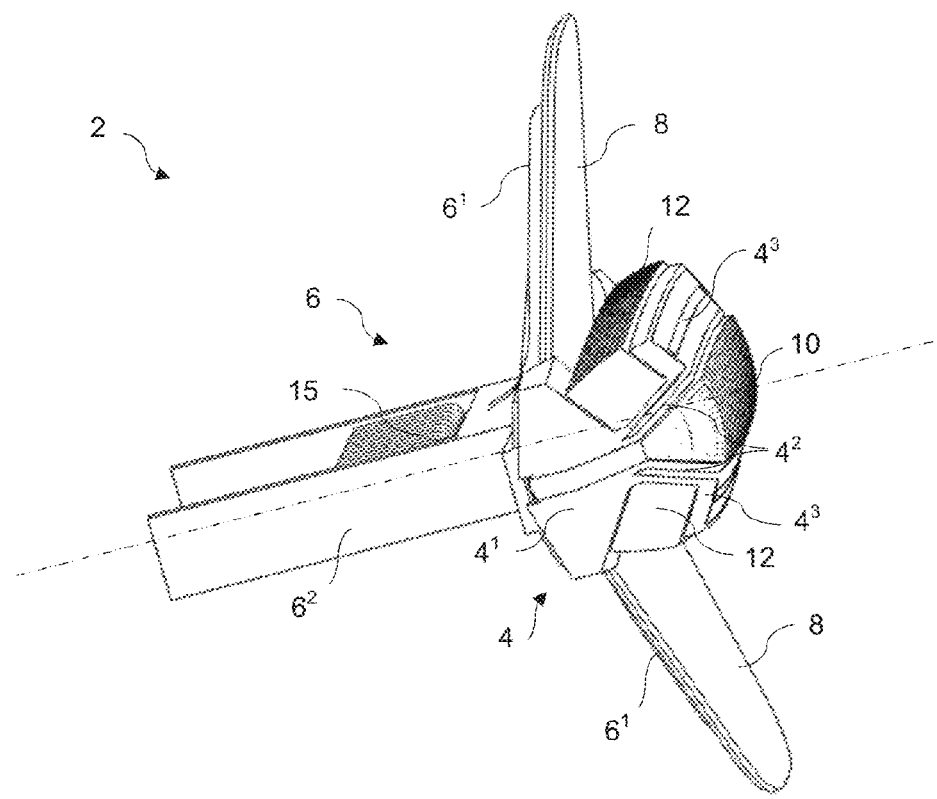
FIG. 1 is a perspective view of a luminous module according to the invention.

FIG. 1 illustrates a luminous signaling module for an automotive vehicle. The module 2 is configured to be housed in a housing placed at the rear of the vehicle. It is configured to provide a tail lamp (or rear light) function, a stoplight function and a direction indicating (or indicator) function.

The module 2 comprises a substrate 4 and a part 6 added to the substrate 4. The added part 6 may be fastened to the substrate 4 by means of screws. The substrate 4 essentially comprises a central section $4^1$, two lateral walls $4^2$ and two frontal walls $4^3$ projecting from the lateral walls $4^2$. The two lateral walls $4^2$ form a cavity housing light sources (not shown) and a collimator 10 with a view to forming a light beam for a direction indicating function.

The added part 6 comprises two holders $6^1$ and a rear section $6^2$. The holders $6^1$ are placed so as to project from the central section $4^1$ of the substrate 4 essentially opposite each other. Each of these holders $6^1$ holds an areal OLED diode 8. An OLED is a light-emitting diode comprising a superposition of a plurality of organic semiconductor layers between two electrodes, (at least) one of which is transparent. In the present case, these OLED diodes 8 provide a tail lamp function. The rear section $6^2$ of the added part 6 is configured to house an electrical supply connector 15.

The substrate 4 of the module 2 also bears one or more light sources (not shown) between the lateral walls $4^2$ and the OLED diodes 8, this or these light sources being covered with a collimator 12 with a view to providing a stoplight function. More precisely, the rays emitted by these light sources and deviated by the collimator 12 encounter the front face of the corresponding OLED diode 8 and are reflected thereby toward the front of the module 2.

Figure 2:
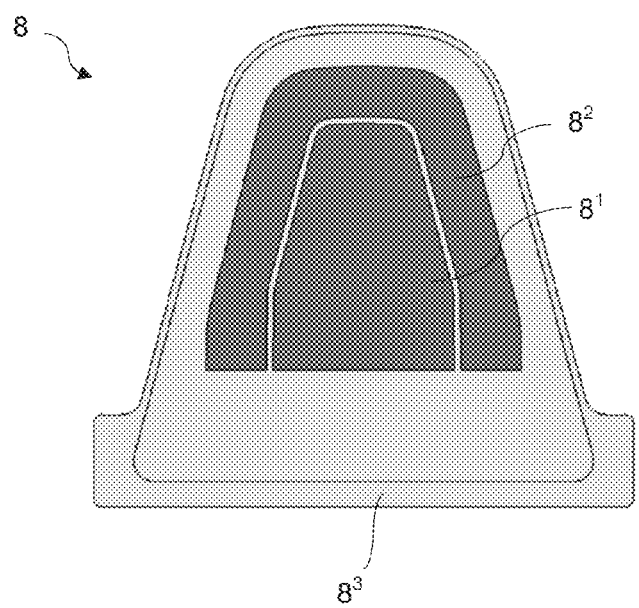
FIG. 2 is a front view of one of the two areal OLED light sources of the module in FIG. 1.

The longitudinal axis of the module 2 shown in FIGS. 1 and 2 corresponds to its optical axis. This means that the various light beams produced by the module 2 are oriented essentially along this axis. All these beams are preferably directed toward the front of the module 2 (corresponding to the right-hand side of FIG. 1 and to the rear of the vehicle).

The collimators 10 and 12 are parts made of a transparent or translucent material such as glass or polycarbonate (PC) or polymethyl methacrylate (PMMA). They comprise entrance surfaces and/or exits oriented so as to deviate the rays in a main direction, on application of the Snell-Descartes refraction principle. Specifically each of the entrance and exit faces forms a diopter, namely a surface separating two uniform and isotropic transparent media of different refractive indices. Specifically, the refractive index of air is about 1 whereas that of glass and polycarbonate is located between about 1.4 and 1.6. The operating principle of a collimator is well known per se by those skilled in the art; it is therefore not necessary to describe it in further detail.

FIG. 2 illustrates an example of an areal OLED diode 8 for the module 2 in FIG. 1. It may be seen that the diode 8 is divided into two illuminating zones, namely a first zone $8^1$ and a second zone $8^2$. Each of these zones may be electrically activated independently.

Again in FIG. 2, the diode 8 comprises an edge $8^3$ intended to allow the diode 8 to be fastened and electrically connected to the holder of the luminous module 2 in FIG. 1.

Figure 3:
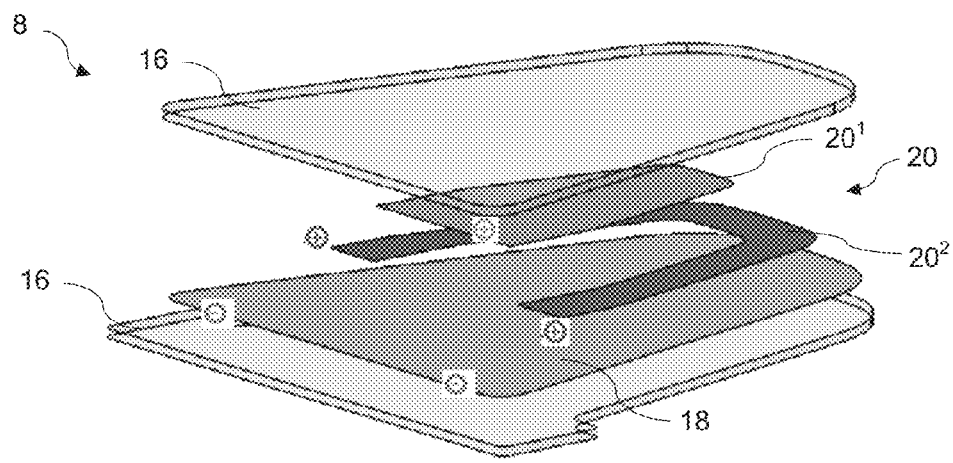
FIG. 3 is an exploded perspective view of the areal OLED light source in FIG. 2.

FIG. 3 illustrates an exploded perspective view of the areal OLED diode 8 in FIG. 2.

It may be seen that the diode 8 comprises two exterior layers 16 intended to protect it from the exterior. These layers 16 are transparent and may especially be made of glass. The diode 8 also comprises a first electrode 18 intended to be connected to a negative potential possibly corresponding to the ground of a vehicle (in the case of mounting on a vehicle). This first electrode 18 is commonly referred to as the cathode. It may be seen that this electrode 18 extends over most of the extent of the diode 8. The latter also comprises a second electrode 20 that is divided into a plurality of portions, in the present case into two portions $20^1$ and $20^2$. The portion $20^1$ corresponds to a central portion whereas the portion $20^2$ skirts around the central portion $20^1$. The portions $20^1$ and $20^2$ in fact correspond to the first and second zones $8^1$ and $8^2$ of the diode 8 such as illustrated in FIG. 2. The second electrode 20, in the present case its two portions $20^1$ and $20^2$, are intended to be raised to a positive potential so as to form an electric field with the first electrode 18. The second electrode 20 is commonly referred to as the anode. In the assembled state of the diode 8, the two anodes $20^1$ and $20^2$ are essentially coplanar, or at least aligned along the extent of the diode 8 in the case where the diode 8 is not planar.

It will be noted that for the sake of clarity, the organic light-emitting layers have not been shown. These layers are in fact present between the two electrodes.

The cathode 18 may be made of calcium or even aluminum especially when it is reflective. The anodes 20 are transparent and may be made of indium tin oxide (ITO). This material is known to have a transparency that is inversely proportional to its conductivity.

Figure 4:
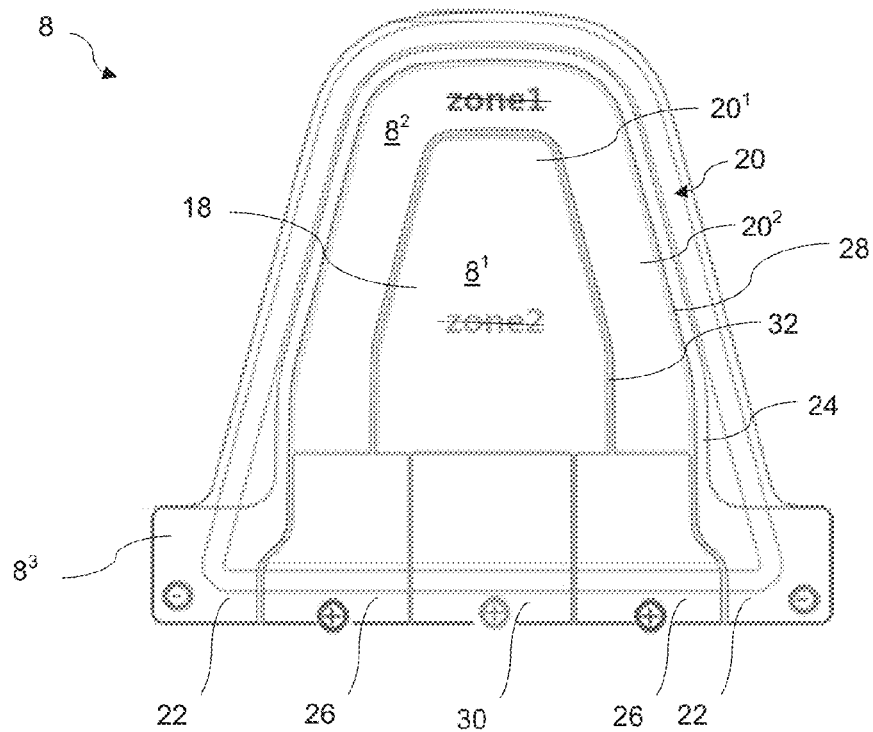
FIG. 4 is a front view of the areal OLED light source in FIG. 2, illustrating the zones of electrical contact.

FIG. 4 is a front view of the diode 8 in FIGS. 2 and 3, illustrating in see-through the electrically connecting zones of the cathode 18 and anodes 20. It may be seen that the electrically connecting zones are located on the mounting edge $8^3$ of the diode 8. The cathode or first electrode 18 is not directly visible insofar as it is hidden by the second electrode 20 ($20^1$ and $20^2$) which is superposed thereon. The cathode 18 is electrically connected to the two electrically connecting zones 22 that are located at the ends of the edge $8^3$. More particularly, an electrical conductor 24 is electrically connected directly to the connecting zones 22 and extends along the perimeter of the cathode 18 with a view to ensuring an optimal electrical distribution. Specifically, the material of the cathode 18 may have a limited electrical conductivity, to the point that the presence of the conductor 24 along its perimeter is useful to ensure a constant potential over the extent of the electrode. The electrical conductor 24 is then preferably made of a metal material able to ensure optimal electrical conduction.

The first anode $20^1$ is electrically connected to the connecting zone 30 that is, in the present case, located essentially at the center of the edge $8^3$ of the diode 8. Similarly to the cathode 18, an electrical conductor 32 taking the form of a metal track may extend along the perimeter of the first anode $20^1$ and be directly connected to the connecting zone 30.

The second anode $20^2$ is electrically connected to the two connecting zones 26 that are, in the present case, located on either side of the connecting zone 30. Similarly to the cathode 18 and first anode $20^1$, an electrical conductor 28 taking the form of a metal track may extend along the perimeter of the second anode $20^2$ and be directly connected to the two connecting zones 26.

As already mentioned above, the material of the anodes must, on the one hand, be transparent and, on the other hand, be conductive. The one or more layers forming the anodes must remain sufficiently thin to remain transparent and, thus, have a certain resistivity that is disadvantageous as regards the uniformity of the light beam emitted by the diode 8. The presence of the conductor (32, 28) along the extent and/or perimeter of the anodes ($20^1$, $20^2$) is then useful to ensure a constant potential over the extent of the electrode (20).

Contact may then be made to the electrically connecting zones 22, 26 and 30 by conductive elastic strips (not shown) borne by the added part 6 of the holder of the module 8 in FIG. 1.

FIG. 5 is a side view of the central and upper section of the luminous module 2 in FIG. 1. The path of a ray 14 emitted by one of the LED diodes 34 illuminating one of the OLED diodes is shown therein. The ray 14 is deviated a first time when it penetrates the transparent or translucent material of the collimator 12. This deviation is not visible on account of the proximity between the diode 34 and the corresponding entrance face of the collimator 12. The ray 14 propagates essentially in a straight line in the material of the collimator 12 until it reaches the exit face, in the present case an exit facet. The ray 14 is then deviated a second time so as to be directed toward a corresponding portion of the OLED diode 8 that is near the central portion $4^1$ of the substrate 4. In other words, the rays emitted by the diodes 34 are deviated by the collimators 12 so as to encounter the corresponding OLED diodes 8 in zones of the diodes that are near the optical axis.

As mentioned above, the OLED diodes 8 consist of a superposition of a plurality of organic semiconductor layers between two electrodes one of which is transparent. In the present case, the electrode located to the rear is reflective so that, on the one hand, the light emitted by the semiconductor layers is effectively directed forward, and on the other hand, the rays emitted by the LED diodes 34 in the direction of the OLED diodes 8 are reflected. The electrode located to the front may therefore be completely or at least mainly transparent.

The OLED diodes 8 advantageously make an angle α to a direction perpendicular to the optical axis of the module 2, this angle α possibly being comprised between 3° and 30°, preferably between 5° and 25° and more preferably between 8° and 20°. The OLED diodes 8 are moreover inclined forward. The angle α is larger than 0 and preferably than 3°, so as to allow the light beam corresponding to the ray 14 to be formed. This angle α is also limited so that the light beam produced by the light rays emitted by the OLED diodes 8 is not too divergent relative to the optical axis.

The light beam produced by reflection of the rays 14 of the LED diodes 34 may thus be produced independently of the activation of the OLED diodes 8. In other words, the light beam of the LED diodes 34 may be added to the light beam produced.

The module 2 just described may thus provide a plurality of luminous signaling functions. In the present case, the central section comprising the LED diodes 36 and the collimator 10, which are housed in the cavity of the substrate 4, may provide a direction indicating function (indicator). The areal OLED diodes 8 may provide a position signaling function (tail lamp). The LED diodes 34 with the collimators 12 and the reflecting property of the OLED diodes 8 may provide a braking indicating function (stop function). Specifically, regulatory photometric requirements are more exacting for the stop function than for the tail lamp function. The presence of a plurality of diodes 34, more particularly on either side of the optical axis, and the reflecting quality of the areal diodes 8 allow these requirements to be met.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. An organic light-emitting diode comprising:
a generally extensive first electrode;
a generally extensive second electrode placed facing said first electrode, said second electrode comprising at least two portions that are electrically insulated from each other;
at least one emissive organic layer placed between said first and second electrodes;
zones for electrically connecting said first and second electrodes; and
a plurality of edges;
wherein
said zones for electrically connecting said first and second electrodes are located on at least one of the edges of said organic light-emitting diode.

2. The organic light-emitting diode according to claim 1, wherein said first electrode is electrically connected to said at least two separate connecting zones.

3. The organic light-emitting diode according to claim 1, wherein at least one of said portions of said second electrode is electrically connected to said at least two separate connecting zones.

4. The organic light-emitting diode according to claim 1, wherein at least one of said portions of said second electrode skirts around said other portion, or one of said other portions, from said edge or one of said edges comprising said electrically connecting zones.

5. The organic light-emitting diode according to claim 4, wherein said portion, or each of said portions, of said second electrode that skirts around said other portion or one of said other portions from said edge comprising the electrically connecting zones is electrically connected to said two separate connecting zones that are placed on said edge on either side of said at least one connecting zone electrically connected to said other or one of said other portions that it skirts around.

6. The organic light-emitting diode according to claim 1, wherein said first electrode and/or at least one of said portions of the said second electrode comprises an electrical conductor extending along said first electrode or electrode portion, said conductor being made of a material different from and more highly electrically conductive than the main material of said first electrode or electrode portion.

7. The organic light-emitting diode according to claim 6, wherein said electrical conductor of said first electrode and/or of said portion or portions of said second electrode extends as far as said zone(s) of electrical contact of said first electrode or electrode portion(s).

8. The organic light-emitting diode according to claim 6, wherein said electrical conductor of said first electrode and/or of said portion or portions of said second electrode extends along an outline of said first electrode or electrode portion(s).

9. The organic light-emitting diode according to claim 1, wherein said first electrode is reflective and/or said second electrode is transparent.

10. The organic light-emitting diode according to claim 1, wherein said electrically connecting zones are located exclusively in the extent of said organic light-emitting diode on one of its two main faces.

11. A luminous module, especially for an automotive vehicle, comprising:
a holder of one or more light sources; and
at least one areal organic light-emitting diode light source on said holder, able to emit a light beam oriented essentially along an optical axis of said module;
wherein
one or more areal light sources comprising an organic light-emitting diode according to claim 1, the light beam being modulatable by selective activation of portions of said second electrode.

12. The luminous module according to claim 11, wherein said one or more areal light sources extend transversely to said optical axis of said module.

13. The luminous module as claimed in claim 11, wherein said light beam emitted by said one or more areal light sources is a first beam, said module comprising one or more additional light sources able to illuminate said one or more areal light sources and to form a second light beam by reflection from said one or more areal light sources.

14. The luminous module according to claim 13, wherein it comprises a collimator able to deviate light rays emitted by said one or more additional light sources in a main direction, said deviated rays encountering said one or more areal light sources with a nonzero angle of incidence.

15. The luminous module according to claim 13, wherein said first beam corresponds to an automotive vehicle position signaling function and/or said second beam corresponds to an automotive vehicle braking signaling function.

16. The organic light-emitting diode according to claim 2, wherein at least one of said portions of said second electrode is electrically connected to said at least two separate connecting zones.

17. The organic light-emitting diode according to claim 2, wherein at least one of said portions of said second electrode skirts around said other portion, or one of said other portions, from said edge or one of said edges comprising said electrically connecting zones.

18. The organic light-emitting diode according to claim 3, wherein at least one of said portions of said second electrode skirts around said other portion, or one of said other portions, from said edge or one of said edges comprising said electrically connecting zones.

19. The luminous module as claimed in claim 12, wherein said light beam emitted by said one or more areal light sources is a first beam, said module comprising one or more additional light sources able to illuminate said one or more areal light sources and to form a second light beam by reflection from said one or more areal light sources.

20. The organic light-emitting diode according to claim 7, wherein said electrical conductor of said first electrode and/or of said portion or portions of said second electrode extends along an outline of said first electrode or electrode portion(s).

* * * * *